(12) United States Patent
Wismann

(10) Patent No.: US 8,784,953 B2
(45) Date of Patent: Jul. 22, 2014

(54) METHOD OF FORMING A CONDUCTIVE IMAGE ON A NON-CONDUCTIVE SURFACE

(75) Inventor: William Wismann, Camarillo, CA (US)

(73) Assignee: Earthone Circuit Technologies Corporation, Carlsbad, CA (US)

( * ) Notice: Subject to any disclaimer, the term of this patent is extended or adjusted under 35 U.S.C. 154(b) by 0 days.

(21) Appl. No.: 13/587,785

(22) Filed: Aug. 16, 2012

(65) Prior Publication Data

US 2013/0043062 A1 Feb. 21, 2013

Related U.S. Application Data

(63) Continuation of application No. 13/403,797, filed on Feb. 23, 2012.

(60) Provisional application No. 61/525,662, filed on Aug. 19, 2011, provisional application No. 61/568,736, filed on Dec. 9, 2011.

(51) Int. Cl.
| | | |
|---|---|---|
| *C23C 18/18* | (2006.01) | |
| *C23C 18/22* | (2006.01) | |
| *H05K 3/10* | (2006.01) | |
| *C23C 18/16* | (2006.01) | |
| *H05K 3/18* | (2006.01) | |
| *H01L 21/288* | (2006.01) | |
| *H01L 21/768* | (2006.01) | |
| *H05K 3/38* | (2006.01) | |

(52) U.S. Cl.
CPC .......... *H05K 3/185* (2013.01); *H05K 2203/104* (2013.01); *H05K 3/105* (2013.01); *H01L 21/288* (2013.01); *C23C 18/18* (2013.01); *C23C 18/1673* (2013.01); *H01L 21/76838* (2013.01); *H05K 3/381* (2013.01); *H05K 2203/1157* (2013.01); *C23C 18/22* (2013.01)

USPC .......................................... 427/598; 427/96.1

(58) Field of Classification Search
CPC ............. H05K 2203/104; H05K 3/181–3/187; C23C 18/16–18/54
USPC ............... 427/551–559, 98.5–99.5, 547–550, 427/598–599, 304–306
See application file for complete search history.

(56) References Cited

U.S. PATENT DOCUMENTS

| | | | | |
|---|---|---|---|---|
| 5,336,370 A | * | 8/1994 | Chipalkatti et al. | ............ 216/83 |
| 5,506,091 A | * | 4/1996 | Suzuki et al. | ................. 430/324 |
| 2005/0018595 A1 | * | 1/2005 | Conroy et al. | ................. 369/288 |
| 2008/0116077 A1 | * | 5/2008 | Sricharoenchaikit | ......... 205/148 |
| 2010/0015362 A1 | * | 1/2010 | Lee et al. | ....................... 427/598 |
| 2010/0032304 A1 | * | 2/2010 | Mayer et al. | .................... 205/97 |

FOREIGN PATENT DOCUMENTS

| | | | | |
|---|---|---|---|---|
| JP | 59017225 | * | 1/1984 | ............. H01F 41/24 |
| JP | 2000-17498 | * | 1/2000 | ............. C25D 19/00 |
| RU | 2039128 C1 | * | 7/1995 | |

OTHER PUBLICATIONS

Hüske et al., Laser Supported Activation and Additive Metallization of Thermoplastics for 3D-MIDS, Aug. 28-31, 2001, Proceedings of the 3rd LANE 2001.*

(Continued)

*Primary Examiner* — James Lin
*Assistant Examiner* — Ho-Sung Chung
(74) *Attorney, Agent, or Firm* — One LLP

(57) ABSTRACT

The present invention relates to a method for forming a raised conductive image on a non-conductive or dielectric surface, the method comprising placing a metal coordination complex on a surface of the substrate, exposing the surface to electromagnetic radiation, reducing the exposed complex. removing unexposed complex leaving an elemental metal image, removing unexposed metal complex and then plating the resulting elemental metal image with a highly conductive material.

31 Claims, 1 Drawing Sheet

(56) References Cited

OTHER PUBLICATIONS

Okumura, English Abstract of "Wet plating system employed in metal wiring layer pattern formation for semiconductor device manufacture has heating chamber interconnected between vacuum chamber and plating apparatus, that performs heat drying of processed object in addition to vacuum drying," Jan. 18, 2000, JP 2000-17498.*

Mizoguchi, English translation of "Method for Manufacturing a Magnetic Recording Medium," Jan. 28, 1984, JP 59017225.*

Zajchenko et al., Method for Chemical Nickel Plating (Machine Translation), RU 2 039 128 C1 (1995).*

* cited by examiner

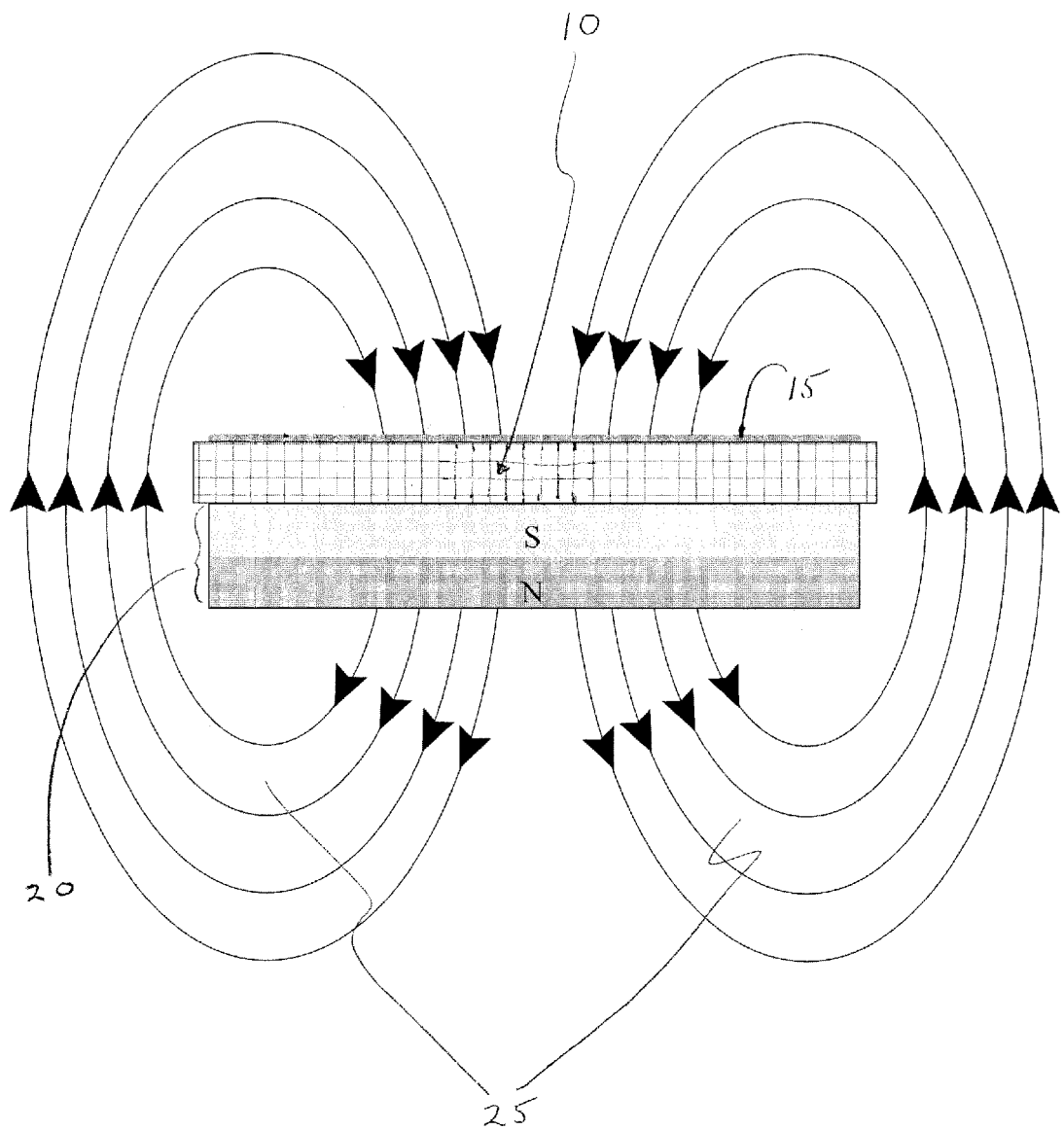

METHOD OF FORMING A CONDUCTIVE IMAGE ON A NON-CONDUCTIVE SURFACE

CROSS REFERENCE TO RELATED APPLICATIONS

This application is related to and claims the benefit of (1) U.S. Provisional Patent Application No. 61/525,662, filed in the name of William Wismann on Aug. 19, 2011, (2) U.S. Provisional Patent Application No. 61/568,736, filed in the name of William Wismann on Dec. 9, 2011, and (3) is a continuation of U.S. patent application Ser. No. 13/403,797, filed in the name of William Wismann on Feb. 23, 2012, all of which are hereby incorporated herein by reference in their entirety.

FIELD

This invention relates to the field of electronic device manufacture.

BACKGROUND

Conductive images on non-conductive or dielectric surfaces are ubiquitous in today's technology-driven world. Perhaps the most widely known example of such are the integrated circuits found in virtually all electronic devices. Integrated circuits result from a sequence of photographic and chemical processing steps by which the circuits are gradually created on a dielectric substrate such as a silicon wafer.

A typical wafer is made out of extremely pure silicon that is grown into mono-crystalline cylindrical ingots, called boules, that are up to 300 mm in diameter. The boules are then sliced into wafers about 0.75 mm thick and polished to obtain a very smooth flat surface.

The formation of a circuit on a wafer requires numerous steps that can be categorized into two major parts: front-end-of-line (FEOL) processing and back-end-of-line (BEOL) processing.

FEOL processing refers to the formation of circuits directly in the silicon. The raw wafer is first subjected to epitaxy, the growth of crystals of ultrapure silicon on the wafer wherein the crystals mimic the orientation of the substrate.

After epitaxy, front-end surface engineering generally consists of the steps of growth of the gate dielectric, traditionally silicon dioxide ($SiO_2$), patterning of the gate, patterning of the source and drain regions, and subsequent implantation or diffusion of dopants to obtain the desired complementary electrical properties. In dynamic random access memory (DRAM) devices, storage capacitors are also fabricated at this time, typically stacked above the access transistor.

Once the various semiconductor devices have been created, they must be interconnected to form the desired electrical circuits, which comprise the BEOL portion of the process. BEOL involves creating metal interconnecting wires that are isolated by dielectric layers. The insulating material was traditionally a form of silicate glass, $SiO_2$, but other low dielectric constant materials can be used.

The metal interconnecting wires often comprise aluminum. In an approach to wiring called subtractive aluminum, blanket films of aluminum are deposited, patterned and etched to form the wires. A dielectric material is then deposited over the exposed wires. The various metal layers are interconnected by etching holes, called vias, in the insulating material and depositing tungsten in the holes. This approach is still used in the fabrication of memory chips such as DRAMs as the number of interconnect levels is small.

More recently, as the number of interconnect levels has increased due to the large number of transistors that now need to be interconnected in a modern microprocessor, the timing delay in the wiring has become significant, prompting a change in wiring material from aluminum to copper and from the silicon dioxides to newer low-K material. The result is not only enhanced performance but reduced cost as well in that damascene processing is substituted for subtractive aluminum technology, thereby elimination several steps. In damascene processing, the dielectric material is deposited as a blanket film, which is then patterned and etched leaving holes or trenches. In single damascene processing, copper is then deposited in the holes or trenches surrounded by a thin barrier film resulting in filled vias or wire lines. In dual damascene technology, both the trench and via are fabricated before the deposition of copper resulting in formation of both vias and wire lines simultaneously, further reducing the number of processing steps. The thin barrier film, called copper barrier seed (CBS), is necessary to prevent copper diffusion into the dielectric. The ideal barrier film is as thin as possible. As the presence of excessive barrier film competes with the available copper wire cross section, formation of the thinnest continuous barrier represents one of the greatest ongoing challenges in copper processing today.

As the number of interconnect levels increases, planarization of the previous layers is required to ensure a flat surface prior to subsequent lithography. Without it, the levels would become increasingly crooked and extend outside the depth of focus of available lithography, interfering with the ability to pattern. CMP (chemical mechanical planarization) is a processing method to achieve such planarization although dry etch back is still sometimes employed if the number of interconnect levels is low.

The above process, although described specifically with regard to silicon chip manufacture, is fairly generic for most types of printed circuits, printed circuit boards, antennas, solar cells, solar thin films, semiconductors and the like. As can be seen, the process is subtractive; that is a metal, usually copper, is deposited uniformly over a substrate surface and then unwanted metal, that is, metal that does not comprise some part of the final circuit, is removed. A number of additive processes are known, which resolve some of the problems associated with the subtractive process but which engender problems of their own, a significant one of which involves adherence of a built-up conducting layer to the substrate.

What is needed is an additive process for integrated circuit fabrication that has all of the advantages of other additive processes but which exhibits improved adhesion properties to substrates. The current invention provides such an additive process.

SUMMARY

Thus, in one aspect this invention relates to a method of forming a conductive layer on a surface, comprising:
activating at least a portion of a non-conductive substrate surface;
applying a magnetic field to the surface;
depositing a metal coordination complex on at least a part of the activated portion of the surface;
removing the magnetic field;
exposing the metal coordination complex to electromagnetic radiation;
reducing the metal coordination complex to elemental metal;

removing unreduced metal coordination complex from the surface;
drying the surface; and
depositing a conductive material onto the surface.

In an aspect of this invention, activating the substrate surface comprises etching the surface.

In an aspect of this invention, etching the surface comprises chemical etching.

In an aspect of this invention, chemical etching comprises acid etching, base etching or oxidative etching.

In an aspect of this invention, etching the surface comprises mechanical etching.

In an aspect of this invention, etching the surface comprises plasma etching.

In an aspect of this invention, etching the surface comprises laser-etching.

In an aspect of this invention, plasma or laser etching comprises etching in a pre-determined pattern.

In an aspect of this invention, the magnetic field has a magnetic flux density of at least 1000 gauss.

In an aspect of this invention, the magnetic field is orthogonal to the surface.

In an aspect of this invention, depositing a metal coordination complex on at least a portion of the surface comprises using a mask.

In an aspect of this invention, the mask comprises an electronic circuit.

In an aspect of this invention, the electronic circuit is selected from the group consisting of an analog circuit, a digital circuit, a mixed-signal circuit and an RF circuit.

An aspect of this invention is an analog circuit fabricated using the method described herein.

An aspect of this invention is a digital circuit fabricated using the method described herein.

An aspect of this invention is a mixed-signal circuit fabricated using the method described herein.

An aspect of this invention is an RF circuit fabricated using the method described herein.

In an aspect of this invention, exposing the metal coordination complex to electromagnetic radiation comprises microwave radiation, infrared radiation, visible light radiation, ultraviolet radiation, X-ray radiation or gamma radiation.

In an aspect of this invention, reducing the metal coordination complex to a zero oxidation state metal comprises using a combination of metals and/or catalysts.

In an aspect of this invention, removing unreduced metal coordination complex from the surface comprises washing the surface with a solvent.

In an aspect of this invention, drying the surface comprises drying at ambient temperature or drying at elevated temperature.

In an aspect of this invention, drying the surface at ambient or elevated temperature comprises using a vacuum chamber.

In an aspect of this invention, depositing a conductive material onto the surface comprises electrolytic deposition of a metal onto the portion of the surface comprising the reduced metal coordination complex.

In an aspect of this invention, electrolytic deposition of a metal onto the portion of the surface comprising the reduced metal coordination complex comprises:
contacting a negative terminal of a direct current power supply with at least the portion of the surface comprising the reduced metal coordination complex;
providing an aqueous solution comprising a salt of the metal to be deposited, an electrode made of the metal immersed in the aqueous solution or a combination thereof;
contacting a positive terminal of the direct current power supply with the aqueous solution;
contacting at least the portion of the surface comprising the reduced metal coordination complex with the aqueous solution; and
turning on the power supply.

In an aspect of this invention, depositing a conductive material onto the surface comprises electroless deposition of a metal onto the portion of the surface comprising the reduced metal coordination complex.

In an aspect of this invention, electrolessly depositing a metal onto the portion of the surface comprising the reduced metal coordination complex comprises contacting at least the portion of the surface comprising the metal coordination complex with a solution comprising a salt of the metal, a complexing agent and a reducing agent.

In an aspect of this invention, depositing a conductive material onto the surface comprises deposition of a non-metallic conductive substance onto the portion of the surface comprising the reduced metal coordination complex.

In an aspect of this invention, the non-metallic conductive material is deposited onto the portion of the surface comprising the reduced metal coordination complex by electrostatic dispersion.

In an aspect of this invention, the entire non-conductive substrate surface is activated and the metal coordination complex is deposited onto the entire surface.

In an aspect of this invention, the entire non-conductive substrate surface is activated and the metal coordination complex is deposited on a part of the activated surface.

DETAILED DESCRIPTION

Brief Description of the Figures

The FIGURE herein is provided solely to assist in the understanding of the present invention and is not intended nor is it to be construed as limiting the scope of this invention in any manner whatsoever.

FIG. 1 shows a substrate to be processed using the method of this invention where the substrate is situated in an magnetic field such that the field is orthogonal to the plane of the surface of the substrate.

DISCUSSION

It is understood that, with regard to this description and the appended claims, reference to any aspect of this invention made in the singular includes the plural and vice versa unless it is expressly stated or unambiguously clear from the context that such is not intended.

As used herein, any term of approximation such as, without limitation, near, about, approximately, substantially, essentially and the like, mean that the word or phrase modified by the term of approximation need not be exactly that which is written but may vary from that written description to some extent. The extent to which the description may vary will depend on how great a change can be instituted and have one of ordinary skill in the art recognize the modified version as still having the properties, characteristics and capabilities of the word or phrase unmodified by the term of approximation. In general, but with the preceding discussion in mind, a numerical value herein that is modified by a word of approximation may vary from the stated value by ±10%, unless expressly stated otherwise.

As used herein, the use of "preferred," "preferably," or "more preferred," and the like refers to preferences as they existed at the time of filing of this patent application.

As used herein, a "conductive layer" refers to an electrically conductive surface, for example, without limitation, a printed circuit.

As used herein, a "non-conductive substrate" refers to a substrate made of an electrically non-conductive material, sometimes referred to as an insulator or a dielectric. Such materials include, without limitation, minerals such as silica, alumina, magnesia, zirconia and the like, glass and most plastics. Specific non-limiting examples include FR4, which is the general grade designation for fiberglass reinforced epoxy resin such as, without limitation, DuPont Kapton® PV9103 polyimide and ULTRALAM® liquid crystal polymer (Rogers Corporation, Chandler Ariz.).

As used herein, to "activate a non-conductive substrate surface," or a portion thereof of, refers to rendering the surface more amenable to interaction with and subsequent physical or chemical bonding to another material that is disposed onto the surface of the substrate. In an embodiment of this invention, the other material can comprise a metal coordination complex. In addition, altering the surface properties also refers to rendering the surface more diffusive toward incident electromagnetic radiation. Altering the surface properties can be accomplished by altering the topography or the permeability of the surface or a combination of the two. The topography of the surface can be altered by mechanical or chemical means or a combination of the two.

Mechanical means of altering the surface properties of the substrate include, without limitation, simple abrasion of the surface such as with sandpaper or another abrasive material, rasping the surface with a file, scoring the surface with a sharp object such as, without limitation, a tool bit, and laser etching. Combinations of these and any other methods that result in an abraded surface are within the scope of this invention.

In some embodiments, the surface may be prepared ab initio using a mold that includes an abraded surface contour and forming the substrate with altered surface properties by disposing a molten polymer into the mold. When removed, the molded object will have an altered surface as compared to an object molded using a smooth-surfaced mold. These methods of altering a surface property are well-known to those skilled in the art and require no further description, Chemical means of altering the surface properties of a substrate include, without limitation, acid etching, base etching, oxidative etching and plasma etching.

Acid etching, as the name implies, refers to the use of a strong acid such as sulfuric acid, hydrochloric acid and nitric acid. A mixture of hydrochloric acid with nitric acid produces aqua regia, an extremely strong acid which can be used to alter the surface properties of a substrate. Most commonly, however, the surface to be acid etched is a glass and the acid use to etch the glass is hydrofluoric acid. This, and other acid etching technologies are well-known in the art and likewise require no detailed explanation.

Base etching is the converse of acid etching and involves the use of a basic substance to alter the topology of the surface of a substrate. Many organic polymers are susceptible to chemical dissolution with basic substances. For instance, without limitation, potassium hydroxide will react with polyesters, polyimides and polyepoxides to alter their surface properties. Other materials susceptible to base etching will be known those skilled in the art. All such materials are within the scope of this invention.

Oxidative etching refers to the alteration of the surface properties of a substrate by contacting the surface with a strong oxidant which as, without limitation, potassium permanganate.

Plasma etching refers to the process of impacting the surface of a substrate with a high-speed stream of a glow discharge of an appropriate gas. The etching species may comprise charged ions or neutral atoms and radicals. During the etch process, elements of the material being etched can chemically react with the reactive species generated by the plasma. In addition, atoms of the plasma-generating substance may imbed themselves at or just below the surface of the substrate, further altering the properties of the surface. As with the other methods of altering the properties of a surface, plasma etching is well-known in the art and needs no further description for the purposes of this invention.

Laser etching is well-known in the art. Briefly, a laser beam is directed at a surface that is within the laser's focal plane. The laser's movement is controlled by a computer. As the laser focal point is moved across the surface, the material of the surface is, generally, vaporized thus leaving the image being traced by the laser on the surface. With regard to this invention, the laser may be used to impart an overall pattern on the surface of a substrate or it may be used to trace the actual image to eventually be rendered conductive onto the substrate.

Another means of altering the surface properties of a substrate involves exposing the surface of the substrate to a fluid that is know of found to soften the surface, often with concomitant swelling of the surface. When a coating material is applied to the swollen surface, the material can physically interact at the boundary between it and the swollen surface, which can result the material being more tightly bound to the surface, in particular when the coated substrate is dried.

As used herein, "applying an magnetic field" to a substrate surface involves placing a surface of the substrate on or near a source of a magnetic field. The magnetic field may be generated by either a permanent magnet, an electromagnet or a combination thereof. A single magnet or plurality of magnets may be used. The surface of the substrate that is in contact with or near the magnet may be the surface opposite to that surface onto which a metal coordination complex is to be deposited or it may be the surface onto which a metal coordination complex is to be deposited. That is, the source of the magnetic field may be above or below the substrate wherein "above" refers to the activated surface of the substrate and "below" refers to the surface opposite the activated surface. If the magnetic field is generated using a permanent magnet, any type of magnet may be used so long as the field strength is at least 1000 gauss, more preferably at least 2000 gauss. A presently preferred permanent magnet is a neodymium magnet. It is also preferred that a permanent magnet have dimensions such that close to or all of the activated surface of the substrate is contained within the dimensions of the magnet. Such an arrangement is shown in FIG. 1. In FIG. 1, substrate 10 has an activated surface 15. Permanent magnet 20 is disposed below substrate 10 and positioned such that the magnetic field generated by the magnet is orthogonal to activated surface 15, which is a presently preferred configuration.

As used herein, a "paramagnetic or ferromagnetic metal coordination complex" is understood to have the meaning that would be ascribed to these classes of metal complexes by those skilled in the art. The metal coordination complex must be ferro- or para-magnetic so that, when disposed on the surface of the substrate, it is affected by the orthogonal magnetic field. Without being held to any particular theory, it is believed that the complex, under the influence of the magnetic field, will either be drawn in toto toward the source of the magnetic field and thereby be more deeply injected into the surface of the substrate or the field may cause the ligands of the complex to align with the magnetic field thereby drawing the ligands further into the substrate. A combination of the two processes may also occur. The result in any case would be more tightly bound complex than that which would be obtained without the influence of the magnetic field.

After the metal coordination complex is applied to the surface of the substrate under the influence of the applied magnetic field, the source of the magnetic field is removed.

The metal coordination complex coated substrate is then exposed to electromagnetic radiation to activate the metal coordination complex toward a reducing agent. As used herein, electromagnetic radiation includes virtually the entire spectrum of such, i.e., microwave, infrared, visible, ultraviolet, X-ray and gamma ray radiation. The composition of the metal coordination complex can be manipulated to render it sensitive to a particular range with the electromagnetic spectrum or, if desired, sensitizer(s) may be added to the complex when it is disposed on the substrate to render the complex photosensitive or, if the complex is inherently photosensitive, to render it even more so. As used here, "photosensitive" has its dictionary definition: sensitive or responsive to light or other radiant energy, which would include each of the types of radiation mentioned above.

Exposure to radiation renders a portion of the metal coordination complex susceptible to reduction. The reducing agent will reduce the metal coordination complex to elemental metal. The reducing agent can be any metal-inclusive salt wherein the metal has a reduction potential that is greater, i.e., conventionally has a more negative reduction potential than the metal of the coordination complex. The following chart shows the reduction potential of a number of common substances. Substances higher on the list are capable of reduction of those beneath it.

| Reducing agent | Reduction potential (V) |
|---|---|
| Li | −3.04 |
| Na | −2.71 |
| Mg | −2.38 |
| Al | −1.66 |
| $H_{2(g)} + 2OH^-$ | −0.83 |
| Cr | −0.74 |
| Fe | −0.44 |
| $H_2$ | 0.00 |
| $Sn^{2+}$ | +0.15 |
| $Cu^+$ | +0.16 |
| Ag | +0.80 |
| $2Br^-$ | +1.07 |
| $2Cl^-$ | +1.36 |
| $Mn^{2+} + 4H_2O$ | +1.49 |

The elemental metal resulting from the reduction step is, of course, insoluble in most solvents. Thus, washing the surface of the substrate with an appropriate solvent, which is determined by the composition of the initial metal coordination complex, will remove unexposed complex leaving the metal. The metal may be evenly dispersed over the surface of the substrate if the surface of the substrate was generally exposed or the metal may form a discrete pattern if the substrate surface was exposed through a mask. A mask is simply a material that is placed between the source of the electromagnetic radiation and the surface of the substrate and which includes an image is to be transferred to the surface of the substrate. The image may be a negative image in which case the portions of the substrate surface that receive radiation corresponds to those portions of the mask that are transparent to the particular radiation or the image may be a positive image in which case the portions of the substrate surface that receive radiation correspond to those portions outside the image areas of the mask.

Once the unexposed metal coordination complex is removed, the substrate with is dried to complete formation of the metal image.

The metal image can be used as is, plated with another metal or coated with a non-metallic conductive material.

If the metal image is to be plated with another metal, such can be accomplished electrolytically or electrolessly. In this manner a conductive metal layer is formed only on the regions of the image comprising the metal image, the result being a raised conductive surface.

Electroless plating of the metal image portions of the surface of the substrate can be accomplished, without limitation, by contacting the surface with a solution of a salt of a metal to be deposited in the presence of a complexing agent to keep the metal ions in solution and to stabilize the solution generally. The surface with the complexed metal salt in contact with it or at least near the surface is simultaneously or consecutively contacted with an aqueous solution of a reducing agent. The metal complex is reduced to afford elemental metal which adheres to the metal image already on the surface of the substrate; i.e., an electrolessly deposited layer of metal on metal results.

The metal complex solution and the reducing solution can be concurrently sprayed onto the patterned substrate either from separate spray units, the spray streams being directed so as to intersect at or near the substrate surface, or from a single spray unit having separate reservoirs and spray tip orifices, the two streams being mixed as they emerge from the spray tip and impinge on the substrate surface.

The electrodeposition process contemplated herein is well-known in the art and need not be extensively described. In brief, the elemental metal image is connected to the negative terminal (cathode) of a direct current power source, which may simply be a battery but, more commonly, is a rectifier. The anode, which constitutes the second metal to be deposited onto the first metal image, is connected to the positive terminal (anode) of the power source. The anode and cathode are electrically connected by means of an electrolyte solution in which the imaged metal surface is submersed or bathed as by contact with a spray of the solution.

The electrolyte solution contains dissolved metal salts of the metal to be plated as well as other ions that render the electrolyte conductive.

When power is applied to the system, the metallic anode is oxidized to produce cations of the metal to be deposited and the positively charged cations migrate to the cathode, i.e., the metal image on the substrate surface, where they are reduced to the zero valence state metal and are deposited on the surface.

In an embodiment of this invention, a solution of cations of the metal to be deposited can be prepared and the solution can be sprayed onto the metalized construct.

The conductive material to be coated on the elemental metal image may also comprise a non-metallic conductive substance such as, without limitation, carbon or a conductive polymer. Such materials may be deposited on the metal image by techniques such as, without limitation, electrostatic powder coating and electrostatic dispersion coating, which may be conducted as a wet (from solvent) or dry process. The process may be carried out by electrostatically charging the metal image and then contacting the image with nano- or micro-sized particles that have been electrostatically charged with the opposite charge to that applied to the metal image. In addition, to further ensure that only the metal image is coated, the non-conductive substrate may be grounded to eliminate any possibility of an attractive charge developing on the substrate or the substrate may be charged with the same polarity charge as the substance to be deposited such that the substance is repelled by the substrate.

EXAMPLES

Example 1

1. DuPont Kapton PV9103 polyimide, in small sheets is chemically etched using a mixture of 0.1 N KOH (5.6 grams potassium hydroxide per 1 liter of deionized water (DI)) with a 60% by weight solution of isopropanol alcohol, for 2 to 4 minutes
2. The etched polyimide sheet is rinsed with DI water and dried for 30 minutes in an oven at 100° C.
3. 10 grams of ferric ammonium oxalate are suspended in 25 ml of DI water (in the darkroom) (Solution 1).
4. 10 grams of ferric ammonium oxalate are mixed with 1.0 gram of potassium chlorate and 25 ml of DI water (also in the darkroom) (Solution 2).
5. 2.3 grams of ammonium tetrachloroplatinate(II) are mixes with 1.7 grams of lithium chloride and 2 ml of DI water (Solution 3).
6. Solutions 1, 2, and 3 are mixed together in equal amounts.
7. The etched polyimide sheet is placed on a 2000 gauss magnet that has dimensions larger than those of the polyimide sheet and the mixture of Step 6 is applied thinly over the surface of the sheet (in the darkroom) with a sponge brush.
8. The coated polyimide sheet was air dried for 30 minutes (alternatively the coated sheet may be placed an oven at 40° C. for about 5 minutes or until dry).
9. A mask comprising the desired pull tab image was placed on top of the coating
10. The masked surface of the polyimide sheet was exposed to an ASC365 ultraviolet light source at full strength for no less than 3 minutes
11. The light source was removed, the mask was separated from the substrate surface and the surface was rinsed for 5 minutes with DI water and then placed in a ethylenediamine tetraacetic acid (EDTA) bath comprising 15 grams of EDTA per 1000 ml of DI water 10 minutes.
12. The rinsed substrate was placed in an oven at 40° C. for 5 minutes or until dry.
13. The substrate was placed in a bath comprising Shipley Electroless Cuposit 328 with 27.5% 328 (A—12.5%, L—12.5%, C—2.5%) and 72.5% DI 25° C. for 5 minute intervals to record plating.
14. The resulting copper-plated polymide was rinsed with DI water for 10 minutes and air dried for 30 minutes (or can be placed in an oven at 40° C. for 5 minutes or until dry).

Example 2

1. A Rogers ULTRALAM 3000 liquid crystal polymer (LCP) sheet was chemically etched with Electro-Brits E-prep 102, approximately 5% by volume (40 grams per liter of sodium hydroxide)
2. The sheet was static rinsed followed by a double cascade rinse.
3. The rinsed etched sheet was then processed with E-Neutralizer and then rinsed again.
4. The sheet was then dipped in a 10% solution of sulfuric acid for 10 seconds and rinsed.
5. 10 grams of silver nitrate were dissolved in 25 ml of DI water (in the darkroom).
6. 5 grams of potassium chromate were mixed with 5 ml of DI water (in the darkroom)
7. Drops of silver nitrate were added to the potassium chromate solution until a red precipitate formed. The mixture was allowed to stand for 24 hours and then was filtered and diluted to 100 ml with DI water (in the darkroom)
8. The sheet was then placed on a 2000 gauss magnet and the silver chromate mixture was thinly applied to it (in the darkroom) with a sponge brush.
9. The coated sheet was placed in an oven at 40° C. for 10 minutes or until dry.
10. A pull test designed mask was placed on the coated surface of the LCP sheet.
11. The masked LPC sheet was then exposed to ultraviolet light from an ASC365 ultraviolet light source for 5 minutes.
12. The UV light source was removed, the LCP sheet was separated from the mask and rinsed for 5 minutes with DI water and then placed in an EDTA bath (15 grams of EDTA, per 1000 ml of DI water) for 10 minutes.
13. The LCP sheet was then rinsed with DI for 10 minutes and put it into an oven at 40° C. for 5 minutes or until dry.
14. The LCP sheet was then placed in a bath comprising Shipley Electroless Cuposit 328 with 27.5% 328 (1-12.5%, L—12.5%, C—2.5%) and 72.5% deionized water at 25° C. for 5 minute intervals to record plating.
15. The copper-plated LCP sheet was removed from the bath, rinsed for 10 minutes and then placed in an oven at 40° C. for 5 minutes until dry.

Example 3

1. A thin sheet (0.15" thickness) of FR4 was chemically etched with a 10% solution of sulfuric acid for 3 minutes and then with a 6% solution of potassium hydroxide.
2. The sheet was then rinsed with DI water.
3. 30 grams of ammonium ferric citrate (the green form, 7.5% ammonia, 15% iron and 77.5% hydrated citric acid) was mixed with 35 ml of warm (50° C.) DI water (in the darkroom) and then made up to a final volume of 50 ml with DI water in an amber bottle (in the darkroom).
4. 1.8 grams of ammonium chloride in 20 ml of hot (70-80° C.) DI water was mixed with stirring with 3 grams of palladium(II) chloride until dissolved, and then made up to 25 ml by addition of DI water.
5. The mixture was filtered and bottled when cool.
6. 6 drops of the ammonium ferric citrate was added to 1 drop of palladium chloride solution in a beaker until 20 ml of solution is obtained (in the darkroom).
7. The FR4 sheet was placed on a 2000 gauss magnet with dimensions larger than those of the FR4 sheet and the coordinated complex solution was sponge brushed thinly on the surface of the sheet (in the darkroom).
8. The FR4 sheet was then place in an oven at 40° C. for 10 minutes or until dry.
9. A pull test designed mask was then placed on the treated surface of the FR4 sheet.
10. The masked FR4 sheet was then exposed to UV light from an ASC365 ultraviolet emitter for 6 minutes.
11. The UV light source was removed, the mask separated from the FR4 sheet, the sheet was rinsed for 5 minutes with DI water and then was placed in an EDTA bath (15 grams of EDTA, per 1000 ml of DI water) 10 minutes.
12. The FR4 sheet was removed from the EDTA bath, rinsed with DI water for 10 minutes and then placed in an oven at 40° C. for 5 minutes or until dry.

13. The FR4 sheet was placed in a bath of Shipley Electroless Cuposit 328 with 27.5% 328 (A—12.5. %, L—12.5%, C—2.5%) and 72.5% deionized water at 25° C. for 5 minute intervals to record plating.

14. The copper plated FR4 sheet was then rinsed for 10 minutes and put it into an oven at 40° C. for 5 minutes until dry.

What is claimed:

1. A method of forming a layer of conductive material on a substrate surface, the method comprising:
    activating at least a portion of the substrate surface;
    depositing a metal coordination complex on a part of the activated portion of the surface;
    applying a magnetic field to the metal coordination complex that is located on part of the activated portion of the substrate surface to align molecules of the metal coordination complex with the magnetic field;
    exposing the metal coordination complex to electromagnetic radiation;
    reducing the metal coordination complex to elemental metal;
    removing unreduced metal coordination complex from the surface;
    drying the surface; and
    depositing a conductive material onto the surface;
    wherein the magnetic field is removed prior to the depositing the conductive material onto the surface.

2. The method of claim 1, wherein activating the substrate surface comprises etching the surface.

3. The method of claim 2, wherein etching the surface comprises chemical etching.

4. The method of claim 3, wherein chemical etching comprises acid etching, base etching or oxidative etching.

5. The method of claim 2, wherein etching the surface comprises mechanical etching.

6. The method of claim 2, wherein etching the surface comprises plasma etching.

7. The method of claim 2, wherein etching the surface comprises laser-etching.

8. The method of claim 6, wherein plasma etching comprises etching in a pre-determined pattern.

9. The method of claim 1, wherein the magnetic field is orthogonal to the surface.

10. The method of claim 1, where depositing a metal coordination complex on at least a portion of the surface comprises using a mask.

11. The method of claim 10, wherein the mask comprises an electronic circuit.

12. The method of claim 11, wherein the electronic circuit is selected from the group consisting of an analog circuit, a digital circuit, a mixed-signal circuit and an RF circuit.

13. The method of claim 1, wherein exposing the metal coordination complex to electromagnetic radiation comprises microwave radiation, infrared radiation, visible light radiation, ultraviolet radiation, X-ray radiation or gamma radiation.

14. The method of claim 1, where reducing the metal coordination complex to elemental metal comprises using a combination of metals and/or catalysts.

15. The method of claim 1, wherein removing unreduced metal coordination complex from the surface comprises washing the surface with a solvent.

16. The method of claim 1, wherein drying the surface comprises drying at ambient temperature or drying at elevated temperature.

17. The method of claim 16, wherein drying the surface at ambient or elevated temperature comprises using a vacuum chamber.

18. The method of claim 1, wherein depositing a conductive material onto the surface comprises electrolytic deposition of a metal onto the portion of the surface comprising the reduced metal coordination complex.

19. The method of claim 18, wherein electrolytic deposition of a metal onto the portion of the surface comprising the reduced metal coordination complex comprises:
    contacting a negative terminal of a direct current power supply with at least the portion of the surface comprising the reduced metal coordination complex;
    providing an aqueous solution comprising a salt of the metal to be deposited, an electrode made of the metal immersed in the aqueous solution or a combination thereof;
    contacting a positive terminal of the direct current power supply with the aqueous solution;
    contacting at least the portion of the surface comprising the reduced metal coordination complex with the aqueous solution; and
    turning on the power supply.

20. The method of claim 1, wherein depositing a conductive material onto the surface comprises electroless deposition of a metal onto the portion of the surface comprising the reduced metal coordination complex.

21. The method of claim 20, wherein electrolessly depositing a metal onto the portion of the surface comprising the reduced metal coordination complex comprises contacting at least the portion of the surface comprising the metal coordination complex with a solution comprising a salt of the metal, a complexing agent and a reducing agent.

22. The method of claim 1, wherein depositing a conductive material onto the surface comprises deposition of a non-metallic conductive substance onto the portion of the surface comprising the reduced metal coordination complex.

23. The method of claim 22, wherein the non-metallic conductive material is deposited onto the portion of the surface comprising the reduced metal coordination complex by electrostatic dispersion.

24. The method of claim 1, wherein the entire substrate surface is activated and the metal coordination complex is deposited onto the entire surface.

25. The method of claim 1, wherein the entire non-conductive substrate surface is activated and the metal coordination complex is deposited on a part of the activated surface.

26. The method of claim 6, wherein etching the surface comprises laser etching in a pre-determined pattern.

27. The method of claim 1, wherein the magnetic field is applied during the step of depositing the metal coordination complex.

28. The method of claim 1, wherein in the step of subjecting the metal coordination complex to the magnetic field, ligands of the metal coordination complex are aligned with the magnetic field.

29. A method of fabricating a substrate, the method comprising the steps of:
    activating at least a portion of the substrate surface;
    depositing a metal coordination complex on a part of the activated portion of the surface;
    applying a magnetic field to the metal coordination complex that is location on part of the activated portion of the substrate surface to align molecules of the metal coordination complex with the magnetic field;
    exposing the metal coordination complex to electromagnetic radiation after the applying;

reducing the metal coordination complex to elemental metal after the exposing;

removing unreduced metal coordination complex from the surface.

30. The substrate according to claim 29, wherein the magnetic field is applied during the step of depositing the metal coordination complex.

31. The substrate according to claim 29, wherein in the step of subjecting the metal coordination complex to the magnetic field, ligands of the metal coordination complex are aligned with the magnetic field.

* * * * *